United States Patent
Hayashi et al.

(10) Patent No.: US 9,299,625 B2
(45) Date of Patent: Mar. 29, 2016

(54) ELECTRONIC COMPONENT CAN PACKAGE STRUCTURE

(71) Applicant: MURATA MANUFACTURING CO., LTD., Nagaokakyo-Shi, Kyoto-fu (JP)

(72) Inventors: Koji Hayashi, Kyoto (JP); Tetsuya Kano, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 14/573,798

(22) Filed: Dec. 17, 2014

(65) Prior Publication Data

US 2015/0170984 A1    Jun. 18, 2015

Related U.S. Application Data

(63) Continuation of application No. PCT/JP2012/066543, filed on Jun. 17, 2013.

(51) Int. Cl.
| | |
|---|---|
| *H01L 23/043* | (2006.01) |
| *H01L 23/049* | (2006.01) |
| *H01L 23/10* | (2006.01) |
| *H01L 25/16* | (2006.01) |
| *H01L 23/04* | (2006.01) |
| *G01J 1/02* | (2006.01) |
| *G01J 5/04* | (2006.01) |
| *G01J 5/02* | (2006.01) |
| *H01L 21/48* | (2006.01) |

(52) U.S. Cl.
CPC ............ *H01L 23/049* (2013.01); *G01J 1/0271* (2013.01); *G01J 5/02* (2013.01); *G01J 5/045* (2013.01); *H01L 21/4803* (2013.01); *H01L 23/04* (2013.01); *H01L 25/165* (2013.01); *H01L 2924/0002* (2013.01); *Y10T 29/49945* (2015.01)

(58) Field of Classification Search
CPC ..... H01L 23/04; H01L 23/043; H01L 23/049; H01L 23/10; H01L 25/16
USPC ................................................... 257/252, 704
See application file for complete search history.

(56) References Cited

U.S. PATENT DOCUMENTS 5,344,518 A * 9/1994 Ito .......................... H01L 37/02
                                                            156/242
5,898,256 A    4/1999  Ide et al.
(Continued)

FOREIGN PATENT DOCUMENTS

| JP | H08-128895 A | 5/1996 |
| JP | 2000-100981 A | 4/2000 |
| WO | WO-97/08826 A1 | 3/1997 |

OTHER PUBLICATIONS

Written Opinion and International Search Report issued in PCT/JP2013/066543 mailed on Sep. 3, 2013.

*Primary Examiner* — Christine Enad
(74) *Attorney, Agent, or Firm* — Arent Fox LLP

(57) ABSTRACT

An electronic component can package structure with a can case having an elliptically-shaped cavity in a state before it is fitted with a supporting base portion of a stem. The supporting base portion of the stem has a circular shape. The cavity of the can case is fitted with the supporting base portion of the stem with elastic deformation of the can case. The long diameter of the cavity has an allowance relative to the outer diameter of the supporting base portion of the stem and a gap for the allowance acts as a contraction margin. The short diameter of the cavity is smaller than the outer diameter of the supporting base portion of the stem, so that the supporting base portion is held between the short diameter portions.

14 Claims, 3 Drawing Sheets

(56) References Cited

U.S. PATENT DOCUMENTS

| | | | | |
|---|---|---|---|---|
| 7,671,335 B2 * | 3/2010 | Nishikawa | | G01J 1/02 250/338.4 |
| 2003/0222218 A1 * | 12/2003 | Nozu | | G01J 5/06 250/338.1 |
| 2012/0235038 A1 * | 9/2012 | Nishikawa | | G01J 5/0014 250/338.3 |

* cited by examiner

ELECTRONIC COMPONENT CAN PACKAGE STRUCTURE

CROSS REFERENCE TO RELATED APPLICATIONS

The present application is a continuation of PCT/JP2013/066543 filed Jun. 17, 2013, which claims priority to Japanese Patent Application No. 2012-145535, filed Jun. 28, 2012, the entire contents of each of which are incorporated herein by reference.

FIELD OF THE INVENTION

The present invention relates to an electronic component package structure, and in particular, relates to an electronic component can package structure including a stem and a can case.

BACKGROUND OF THE INVENTION

A can package is used for a package structure that is sealed in an airtight manner and has high environment resistance, a package structure of a sensor or the like, which includes a window portion, or a package structure requiring an electrostatic shield. For example, Patent Document 1 discloses a pyroelectric infrared sensor with a can package structure.

In the pyroelectric infrared sensor disclosed in Patent Document 1, an alumina substrate on which a predetermined rectangular electrode pattern is formed, a field effect transistor (FET), and a supporting base are arranged on a stem, a window portion is formed on a can case, and an optical filter is bonded to the window portion. The can case is firmly fixed to the stem so as to be sealed.

Patent Document 1: Japanese Unexamined Patent Application Publication No. 8-128895

A can package including a stem and a can case is configured by fitting an cavity of the can case with a supporting base portion of the stem and performing resistance welding. A fitting tolerance is defined between the outer diameter of the supporting base portion of the stem and the inner diameter of the cavity of the can case. This generates a predetermined gap between the outer diameter of the supporting base portion of the stem and the inner diameter of the cavity of the can case in a state where the can case is made to cover the stem. That is to say, the gap is previously provided so as to make "fitting" at the time of assembly even when the outer diameter of the disk-like supporting base portion of the stem and the inner diameter of the cavity of the can case have fluctuations in dimensions.

However, relative rotation slippage is easy to be generated between the can case and the stem at the time of the resistance welding. This requires an operation for restricting the rotation slippage between the can case and the stem immediately before the resistance welding. Further, the can case and the stem are combined with no tightening force during storage in a state where the can case and the stem are combined before the resistance welding. Due to this, they are easy to be slipped or detached and work efficiency is not preferable.

SUMMARY OF THE INVENTION

An object of the present invention is to provide a can package structure that prevents a can case and a stem from being slipped during assembly and storage, improves work efficiency, and obtains high assembly accuracy.

The present invention provides a can package structure including a stem having a disk-like supporting base portion and a can case having an cavity which is fitted with the supporting base portion of the stem, and at least the cavity of the can case has an elliptical shape in a state before the cavity is fitted with the supporting base portion of the stem, a length of the elliptical shape in a short-axis direction is slightly smaller than a diameter of the supporting base portion of the stem, and a shape of the cavity of the can case in a fitted state is identical to a shape of the supporting base portion of the stem with elastic deformation of the can case.

According to the present invention, the following effects are obtained.

(1) The can case and the stem can be fitted with each other reliably at a stage before resistance welding so as to prevent slippage during storage.

(2) Slippage between the can case and the stem is suppressed when setting them to a resistance welding electrode so as to improve work efficiency.

(3) The can case and the stem are held with a predetermined fitting strength so as to prevent slippage between the can case and the stem due to shock at the time of the welding.

DETAILED DESCRIPTION OF THE EXEMPLARY EMBODIMENTS

Figure 1:
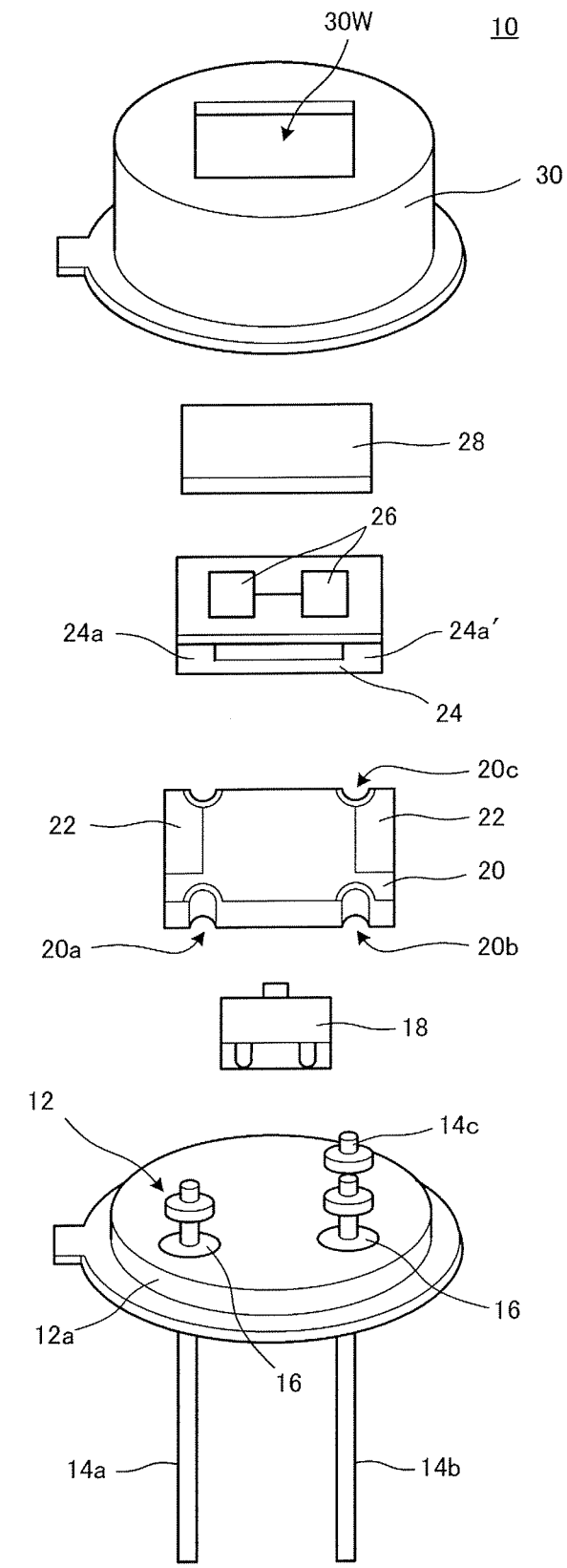
FIG. 1 is an exploded perspective view illustrating a pyroelectric infrared sensor 10 according to an embodiment of the invention.
Figure 2A:
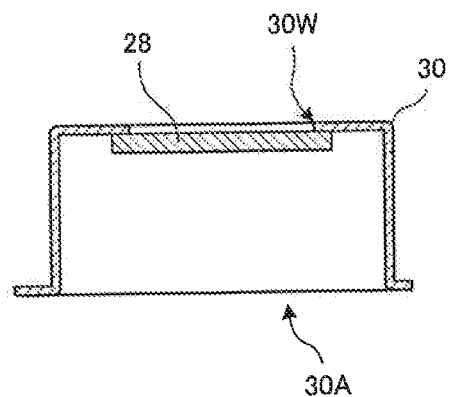
FIG. 2(A) is a cross-sectional view illustrating a can case in a state where an optical filter 28 is bonded thereto and FIG. 2(B) is a bottom view illustrating the can case in the state where the optical filter 28 is bonded thereto when seen from the side of an cavity.
Figure 2B:
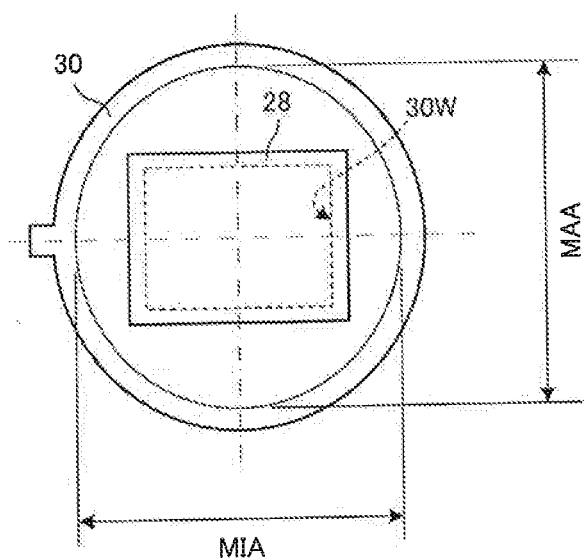
Figure 3:
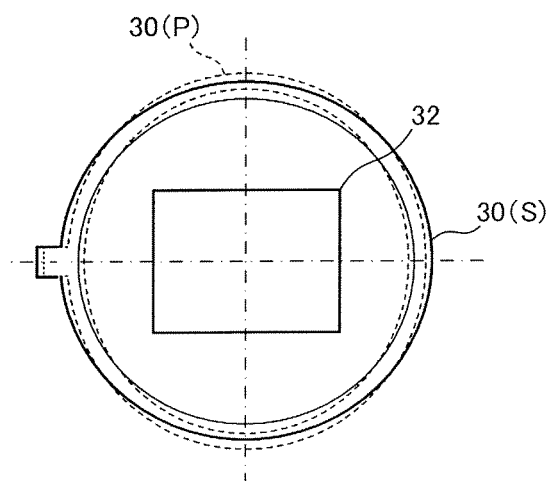
FIG. 3 is a plan view illustrating the pyroelectric infrared sensor 10 when seen from the side of a window portion.

FIG. 1 is an exploded perspective view illustrating a pyroelectric infrared sensor 10 according to an embodiment of the invention. FIG. 2(A) is a cross-sectional view illustrating a can case in a state where an optical filter 28 is bonded thereto and FIG. 2(B) is a bottom view illustrating the can case in the state where the optical filter 28 is bonded thereto when seen from the side of an cavity. FIG. 3 is a plan view illustrating the pyroelectric infrared sensor 10 when seen from the side of a window portion.

The pyroelectric infrared sensor 10 as illustrated in FIG. 1 includes a stem 12 made of metal and a can case 30 made of metal. The stem 12 includes a disk-like supporting base portion (stem base) 12a. Three terminal pins 14a to 14c are formed on the supporting base portion 12a so as to pass through the supporting base portion 12a in the thickness direction. Among this, the terminal pins 14a and 14b are attached (hermetic-sealed) to the supporting base portion 12a with glass members 16 interposed therebetween and the terminal pin 14c is attached to the supporting base portion 12a directly. Flange-like members for supporting an alumina substrate 20 are formed in the vicinities of upper end portions of the respective terminal pins 14a to 14c so as to project in the direction orthogonal to the axial directions of the terminal pins 14a to 14c. The flange-like members support the alumina substrate 20 such that the alumina substrate 20 is distanced from the supporting base portion 12a.

An FET 18 is attached to the lower surface of the alumina substrate 20. A plurality of predetermined electrode patterns 22 are formed on the alumina substrate 20. Respective terminals of the FET 18 are electrically connected to the respective electrode patterns 22 on the alumina substrate 20. Recess portions 20a to 20c into which the terminal pins 14a to 14c are fitted are formed in the vicinities of three corners of the alumina substrate 20. The terminal pins 14a to 14c are fitted into the recess portions 20a to 20c, respectively, and are electrically connected and firmly fixed to the respective electrode patterns 22 with conductive pastes and the like.

A supporting base 24 having a substantially recessed cross section is firmly fixed to the upper surface of the alumina substrate 20. The supporting base 24 supports a pyroelectric element 26 and functions as a high resistor for obtaining an output voltage. The vicinities of both end portions of the supporting base 24 are electrically connected to the corresponding electrode patterns 22. The supporting base 24 is preferably made of a material such as a borosilicate glass or an alkali-free glass, for example, in a point that they have a low thermal conductivity, a large mechanical strength, and a resistance value of approximately $10^{11}$ Ω.

The dual-type pyroelectric element 26 is arranged on the upper surface of the supporting base 24. The vicinities of both end portions of the pyroelectric element 26 in the lengthwise direction are firmly fixed and electrically connected to protrusions 24a and 24a' of the supporting base 24. A window portion 30W is opened on the can case 30 and the optical filter 28 is made to adhere to the window portion 30W.

The cavity of the can case 30 is resistance-welded to the outer circumferential portion of the supporting base portion 12a of the stem 12, so that a package inner portion is sealed.

As illustrated in FIG. 2(A), the can case 30 has an elliptical shape (when alone) in a state before it is fitted with the supporting base portion 12a of the stem 12. On the other hand, the supporting base portion 12a of the stem 12 has a circular shape. The outer diameter of the supporting base portion 12a is smaller than a long diameter MAA of the cavity 30A of the can case 30 and is larger than a short diameter MIA thereof. The cavity 30A of the can case 30 is fitted with the supporting base portion 12a of the stem with elastic deformation of the can case 30. That is to say, the long diameter of the cavity 30A has an allowance relative to the outer diameter of the supporting base portion 12a of the stem and a gap for the allowance acts as a contraction margin. The short diameter of the cavity 30A is smaller than the outer diameter of the supporting base portion 12a of the stem, so that the supporting base portion 12a is held between the short diameter portions.

Figure 4:
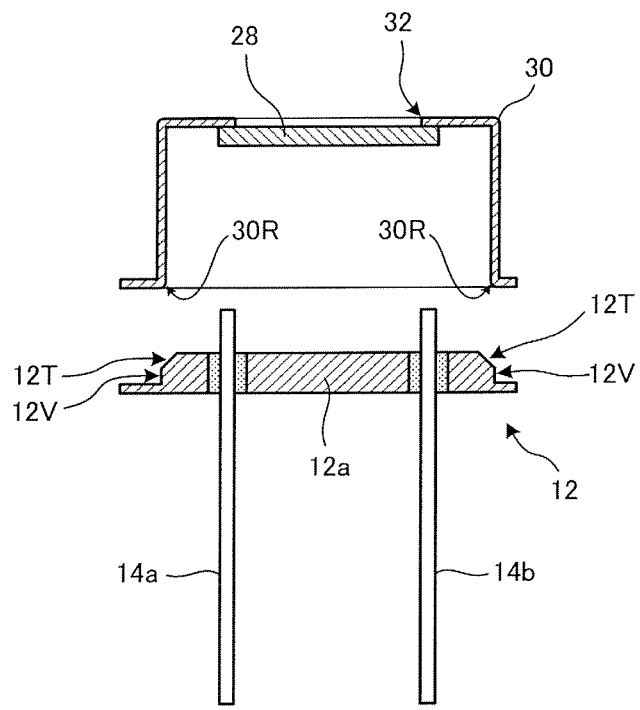
FIG. 4 is a cross-sectional view illustrating a state when a can case 30 is fitted with a stem 12.

FIG. 4 is a cross-sectional view illustrating a state when the can case 30 is fitted with the stem 12. The cross section is a plane passing through the short diameter MIA as illustrated in FIG. 2(B). The configuration on the supporting base portion 12a of the stem 12 is not illustrated in FIG. 4. The supporting base portion 12a includes a tapered portion 12T with which the inner peripheral edge 30R of the cavity of the can case makes contact and a vertical portion 12V extending to a flange portion of the stem 12 from the tapered portion 12T. An inner peripheral edge 30R of the cavity of the can case is formed to be rounded.

When the can case is press-fitted with the stem 12, the inner peripheral edge 30R of the cavity of the can case moves along the tapered portion 12T of the supporting base portion 12a of the stem in a slide manner and the shape of the cavity having the elliptical shape is deformed to a circular shape. When the can case is further press-fitted, the cavity of the can case holds the vertical portion 12V of the supporting base portion of the stem in the short-axis direction in a pressing manner. The tapered portion 12T may have a rounded shape.

With the configuration as illustrated in FIG. 4, the can case is deformed so as to be fitted with the stem only by press-fitting the can case 30 with the stem 12.

Note that the tapered portion 12T is not necessarily required to be formed on the supporting base portion 12a of the stem. For example, the can case 30 may be pressed along the long-axis direction thereof so as to cover the supporting base portion 12a of the stem in a state where the cavity 30A is elastically deformed to have a substantially circular shape. Also in this case, when the press of the can case 30 is cancelled, the can case holds the supporting base portion 12a of the stem with elasticity thereof.

According to the invention, during storage before the can case 30 is resistance-welded to the stem 12, the cavity of the can case is in the state of being fitted with the supporting base portion 12a of the stem 12 but the short diameter portions of the cavity 30A of the can case 30 elastically hold the supporting base portion 12a of the stem therebetween. This can maintain the state where the cavity 30A of the can case is fitted with the supporting base portion 12a of the stem 12 so as to prevent slippage during the storage.

Further, slippage is also suppressed at the time of setting onto a resistance welding electrode for resistance-welding the cavity 30A of the can case to the outer circumferential portion of the supporting base portion 12a of the stem. Therefore, work efficiency of the resistance welding is improved. Further, resistance welding is performed in a state where the stem 12 and the can case 30 are held with a predetermined fitting strength so as to prevent slippage due to shock at the time of the welding.

Positioning at the time of the welding can be arranged offline so as to perform an operation of the resistance welding efficiently and improve process time of a facility.

Although overall the cylindrical portion of the can case is formed in an elliptical cylindrical form in FIG. 2 and FIG. 3, the same actions are made in the case where the bottom portion (surface at the side opposite to the cavity) of the can case is circular and the cylindrical portion gradually becomes elliptical toward the cavity when round slices thereof from the bottom portion to the cavity are observed.

In addition, the pyroelectric infrared sensor as described in the embodiment is an example and it is needless to say that the invention can be applied to can package structures of various electronic components, which include the stem and the can case.

REFERENCE SIGNS LIST

MAA LONG DIAMETER
MIA SHORT DIAMETER
10 PYROELECTRIC INFRARED SENSOR
12 STEM
12A SUPPORTING BASE PORTION
14a, 14b, 14c TERMINAL PIN
16 GLASS MEMBER
18 FET
20 ALUMINA SUBSTRATE
20a RECESS PORTION
22 ELECTRODE PATTERN
24 SUPPORTING BASE
26 PYROELECTRIC ELEMENT
28 OPTICAL FILTER
30 CAN CASE
30A CAVITY
30W WINDOW PORTION

The invention claimed is:

1. An electronic component structure comprising:
a stem having a circular support base; and
a can case having a deformable cavity configured to be fitted with the circular support base of the stem,
wherein the deformable cavity of the can case has an elliptical shape with at least one cross-sectional length of the elliptical shape that is smaller than a diameter of the circular support base of the stem, and
wherein the deformable cavity of the can case conforms to the circular support base of the stem when the deformable cavity of the can case is fitted to the circular support base of the stem.

2. The electronic component structure according to claim 1, wherein the circular support base comprises a vertical portion and a tapered portion.

3. The electronic component structure according to claim 2, wherein the deformable cavity of the can case slides on the tapered portion of the circular support base when the an case is fitted to the circular support base.

4. The electronic component structure according to claim 1, wherein the circular support base of the stem comprises a plurality of cavities with a plurality of terminal pins secured in the plurality of cavities, respectively.

5. The electronic component structure according to claim 4, wherein a glass member is disposed within at least one of the plurality of cavities to secure one of the terminal pins, and wherein at least one of the terminal pins is secured directly to a respective cavity in the circular support base.

6. The electronic component structure according to claim 4, further comprising a substrate with a plurality of recesses for receiving the plurality of terminal pins, respectively.

7. The electronic component structure according to claim 6, further comprising an FET disposed on a first surface of the substrate that is adjacent to the circular support base of the stem.

8. The electronic component structure according to claim 7, further comprising wherein the substrate further comprises at least one electrode pattern and the FET is electrically connected to the at least one electrode pattern.

9. The electronic component structure according to claim 8, further comprising a pyroelectric element disposed on a supporting base that is coupled to a second surface of the substrate opposite the first surface.

10. The electronic component structure according to claim 9, wherein the can case comprises a window in a top surface of the can case, the window being adjacent to the pyroelectric element when the deformable cavity of the can case is fitted to the circular support base of the stem.

11. The electronic component structure according to claim 10, further comprising an optical filter disposed in the window of the can case.

12. A method for manufacturing an electronic component structure, the method comprising:
providing a stem having a circular support base; and
press fitting a can case having a deformable cavity on with the circular support base of the stem, with the deformable cavity of the can case has an elliptical shape with at least one cross-sectional length of the elliptical shape that is smaller than a diameter of the circular support base of the stem, and
wherein, when the can case is press fit to the circular support base, the deformable cavity conforms to the circular support base of the stem.

13. The method according to claim 12, wherein the circular support base comprises a vertical portion and a tapered portion.

14. The method according to claim 13, wherein the press fitting step further comprises sliding the deformable cavity of the can case on the tapered portion of the circular support.

* * * * *

UNITED STATES PATENT AND TRADEMARK OFFICE
CERTIFICATE OF CORRECTION

PATENT NO.         : 9,299,625 B2
APPLICATION NO.    : 14/573798
DATED              : March 29, 2016
INVENTOR(S)        : Koji Hayashi et al.

It is certified that error appears in the above-identified patent and that said Letters Patent is hereby corrected as shown below:

On the title page, under caption: Related U.S. Application Data

(63) Continuation of application No. PCT/JP2012/066543, filed on Jun. 17, 2013, it should read:

\*\*\*(63) Continuation of application No. PCT/JP2013/066543, filed on Jun. 17, 2013\*\*\* and the following caption was omitted, please add the below:

\*\*\*(30) Foreign Application Priority Data

Jun. 28, 2012 (JP).................................2012-145535\*\*\*

Signed and Sealed this
Twenty-eighth Day of June, 2016

Michelle K. Lee
*Director of the United States Patent and Trademark Office*